United States Patent [19]
Katoh et al.

[11] Patent Number: 5,963,785
[45] Date of Patent: Oct. 5, 1999

[54] DIELECTRICALLY-ISOLATED INTEGRATED CIRCUIT

[75] Inventors: Toshimitu Katoh; Yoshiaki Aizawa; Hisaya Okumura, all of Tokyo, Japan

[73] Assignee: Kabushiki Kaisha Toshiba, Kawasaki, Japan

[21] Appl. No.: 08/808,647

[22] Filed: Feb. 28, 1997

[30] Foreign Application Priority Data

Feb. 29, 1996 [JP] Japan .................................. 8-043174

[51] Int. Cl.⁶ .................................................. H01L 21/302
[52] U.S. Cl. ............................ 438/33; 438/68; 438/114; 438/458; 438/460; 438/465
[58] Field of Search .................... 438/33, 68, 113, 438/114, 458, 460, 461, 462, 463, 464, 465, FOR 386, FOR 387

[56] References Cited

U.S. PATENT DOCUMENTS 4,364,078  12/1982  Smith et al. .
5,543,365  8/1996  Willis et al. .

*Primary Examiner*—David Graybill
*Attorney, Agent, or Firm*—Finnegan, Henderson, Farabow, Garrett & Dunner, L.L.P.

[57] ABSTRACT

In a semiconductor integrated circuit consisting of a plurality of semiconductor chips each having a plurality of islands, two or more bonding wires each having different potential are connected to bonding pads formed on the surface of semiconductor chips. The islands are isolated by a dielectric isolation region comprising polysilicon film and isolation film formed in an isolation groove. The polysilicon film is exposed at a dicing line region around the semiconductor chip and a surface of the polysilicon film is made highly resistive. If two or more bonding wires come into contact with the polysilicon film exposed at a peripheral region of the semiconductor chip to cause short circuit, parasitic conductance does not occur between two or more bonding wires because the peripheral region of the semiconductor chip has high resistivity, whereby variation in characteristics of the semiconductor integrated circuit can be suppressed.

23 Claims, 12 Drawing Sheets

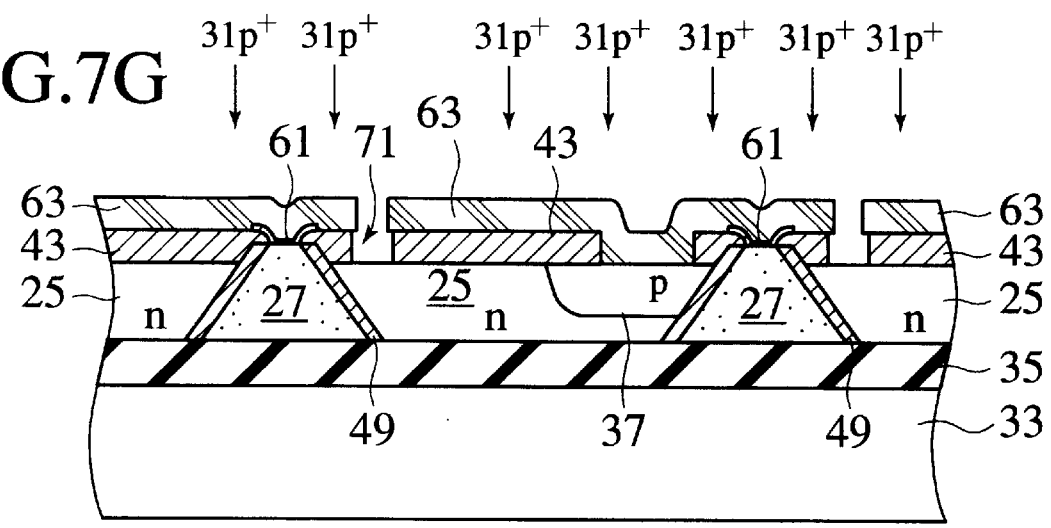
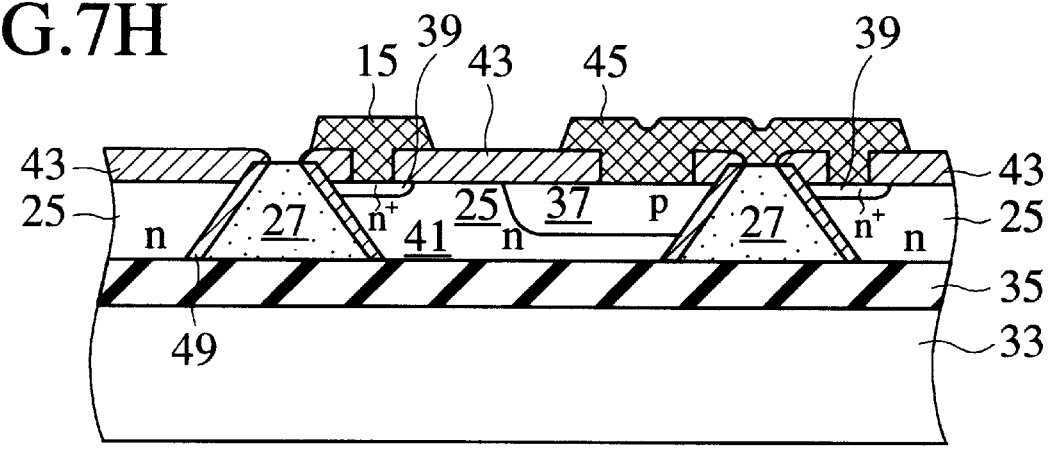
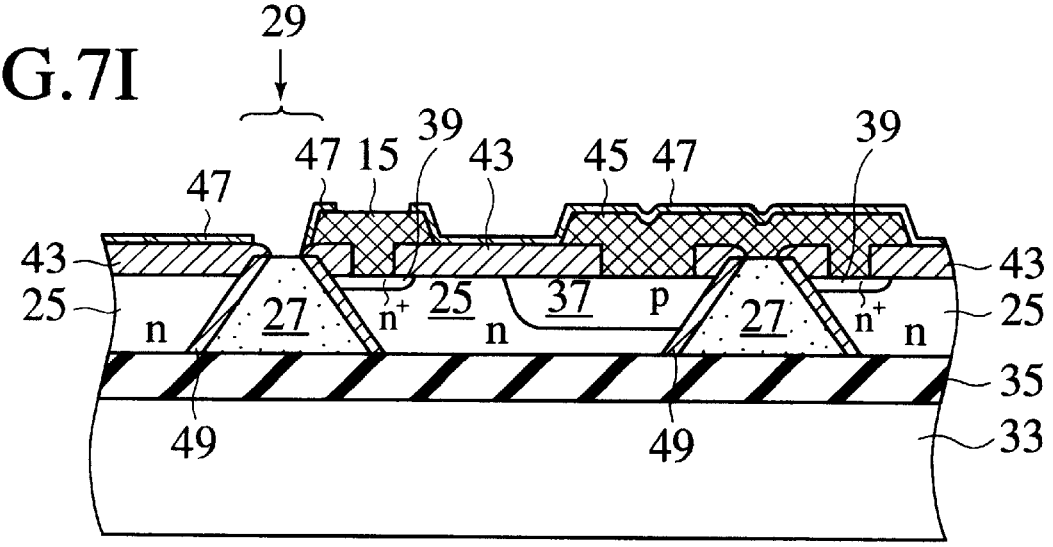

DIELECTRICALLY-ISOLATED INTEGRATED CIRCUIT

BACKGROUND OF THE INVENTION

1. Field of the Invention

The present invention relates to a dielectrically-isolated semiconductor integrated circuit in which two or more bonding wires are connected to semiconductor chips having a dielectrically-isolated structure (hereinafter called "DI structure") and, more particularly, a dielectrically-isolated semiconductor integrated circuit which is able to achieve less variation in characteristics due to underloop of bonding wires and which is to be manufactured with high reliability at low cost.

2. Description of the Prior Art

A device isolation step in manufacturing steps of the semiconductor integrated circuit corresponds to steps of defining regions in which respective elements (e.g., a diode or a transistor) constituting an integrated circuit are formed and isolating adjacent elements to insulate them electrically. A DI structure may be considered as one of device isolation structures. Such DI structure is a structure wherein the elements are isolated by a dielectric substance such as oxide film.

An optical semiconductor switch, or the optical coupler using the DI structure in the prior art will be explained hereinbelow. The ordinary optical semiconductor switch comprises a light emitting diode (referred to as "LED" simply hereinafter) as a light emitting device, a photodiode array as a light receiving device, an impedance component connected in parallel with the photodiode array, and a metal oxide semiconductor field effect transistor (referred to as "MOSFET" simply hereinafter) in which a gate G and a source S are connected to an anode and a cathode of the photodiode array respectively. As a result, the impedance component is connected between the gate and source of the MOSFET. In a hybrid IC structure that is well known, the photodiode array and the impedance element are integrated in a first semiconductor chip while the MOSFET is integrated in a second semiconductor chip, and both semiconductor chips are mounted on a predetermined substrate or a lead frame and then connected by bonding wires.

The optical semiconductor switch generates an optical electromotive force across the photodiode array by turning on the LED and irradiating the emitted light on the photodiode array. Then the optical electromotive force generated in the photodiode array is applied between the gate G and the source S of the MOSFET to render the MOSFET conductive (turn-on state). In contrast, the switch ceases the optical electromotive force generated in the photodiode array by turning off the LED, and discharges charges accumulated in an electrostatic capacitance between the gate G and the source S of the MOSFET via the impedance component connected in parallel with the photodiode array to render the MOSFET nonconductive (turn-off state). In this manner, a switching operation of the MOSFET is carried out by turning the LED on and off.

FIG. 1A is a perspective view showing a schematic structure of four photodiode array chips (first semiconductor chip) 9 immediately after the wafer is cut out by dicing. As shown in FIG. 1A, each photodiode array chip 9 has the DI structure wherein a plurality of Si islands 25 serving as active regions in which photodiodes constituting the photodiode array are formed in a one-by-one correspondence. Each active region is isolated by an isolation film (isolation oxide film) 49 made of a dielectric substance. Further, a polysilicon film 27 (sheet resistance: 1 MΩ/□) is buried in the isolation groove between the n type Si islands 25 to planarize a surface of the chip.

In order to constitute the optical semiconductor switch, the first semiconductor chip shown in FIG. 1A and the second semiconductor chip in which the MOSFET is integrated are mounted on the predetermined substrate or the lead frame. Usually, the semiconductor chip is fabricated in such a manner that plural same circuit patterns are formed on one sheet of wafer by lithography technique such as by using a stepper and respective circuit patterns are cut out along dicing lines and divided in a predetermined size. A plurality of photodiode array chips 9 shown in FIG. 1A are obtained by cutting along the dicing line 29 around the respective chips.

Bonding pads serving as electrodes for connecting the chips and the bonding wires used as external lead lines are formed on the first semiconductor chip (photodiode array chip) 9 and the second semiconductor chip (MOSFET chip), though not shown. Although metal layers. etc. on the surface are omitted from FIG. 1A, practically the anode pad to which the anode of the photodiode is to be connected and the cathode pad to which the cathode of the photodiode is to be connected are formed on the photodiode array chip. On the other hand, the gate pad to which the gate G of the MOSFET is to be connected, the source pad to which the source of the MOSFET is to be connected, and the drain pad to which the drain of the MOSFET is to be connected are formed on the MOSFET chip. Still further, in order to connect electrically the photodiode array chip 9 to the MOSFET chip (not shown), the anode pad and the cathode pad formed on the photodiode array chip 9 are connected to the gate pad and the source pad formed on the MOSFET chip via two bonding wires respectively.

As shown in FIG. 1B, one of the photodiode array chips shown in FIG. 1A is mounted on a substrate 91 by adhesive 92 (or solder) after the dicing process. FIG. 1B is a sectional view showing the photodiode array chip 9 in the prior art after wire bonding is implemented. Because of deformation, etc. due to variation in assembling steps or a temperature cycle test, as shown in FIG. 1B, it is likely to cause underloop of two bonding wires 21, 23. At this time, if both the bonding wires 21, 23 come into contact with edges of the chip (indicated by A and B in FIG. 1B), parasitic resistance (parasitic conductance) occurs between the anode pad 13 and the cathode pad 15 of the photodiode array via the polysilicon film 27 since different potential is applied to the bonding wires 21, 23. FIG. 1C is an equivalent circuit diagram showing the parasitic resistance $5a$ at a case that underloop of the bonding wires is caused in the optical semiconductor switch in the prior art. In FIG. 1C, a reference 1 denotes the LED, and 7, the MOS FET. The impedance component 5 and the parasitic resistance (parasitic conductance) $5a$ are connected in parallel with the photodiode array 3.

The problem arising in the optical semiconductor switch in the prior art will be discussed in detail with reference to FIG. 1C. For instance, in the event that the impedance component 5 is designed as several MΩ, switching speed of the optical semiconductor switch is given as several hundreds μs and $I_{FT}$ (input current) to the LED 1 is about 1 mA. However, if the parasitic resistance (parasitic conductance) $5a$ occurs, a total impedance component between the anode A and the cathode K of the photodiode array 3 is determined by the parasitic resistance and lowered to several tens kΩ. For this reason, an output of the LED 1 must be enhanced so that $I_{FT}$ is increased up to about 10 mA. Therefore, if the parasitic resistance 5a has occurred, a normal input current fails to operate the optical semiconductor switch. Since underloop of the bonding wires shown in 1B is highly generated on the secondary side of the bonding, such underloop becomes an issue particularly if the anode pad 13 and the cathode pad 15 of the photodiode array chip 9 are connected on the secondary side by wedge type bonding or stitch type bonding.

As a method to overcome the problem in the prior art, it may be considered to form an insulating coating film on a surface of the bonding wire. But there has been another problem to cause degradation in bonding strength. Further the manufacturing cost of the semiconductor device increases, since material of the insulating coating film causes inferior contact between the bonding wire and the metal for the bonding pad and the coating film requires additional steps making the bonding technique complicated.

SUMMARY OF THE INVENTION

The present invention has been made in view of the above circumstances, and it is an object of the present invention to provide a dielectrically-isolated (DI) semiconductor integrated circuit such as an optical semiconductor switch (optical coupler) which is able to achieve less variation in characteristics due to underlooping contact of bonding wires to the surface of a semiconductor chip and which is manufactured with high reliability at low cost.

It is another object of the present invention to provide a method for manufacturing a DI semiconductor integrated circuit to achieve less variation in characteristics with high reliability at low cost even if underloop of bonding wires is caused.

In order to attain the above objects, the present invention is characterized in that a semiconductor integrated circuit having a dielectric isolation region (DI region) consisting essentially of an isolation film formed on an inner wall of an isolation groove digged in a semiconductor chip and a polysilicon film formed on the isolation film to bury the isolation groove. The semiconductor chip of the present Invention has bonding pads to which two or more bonding wires with different potential are connected. Further, in the semiconductor chip, a part of the DI region is used as a dicing line region, and a surface of the polysilicon film disposed on the dicing line region is exposed to air, or passivation gas. A peripheral portion of the semiconductor chip, or the naked DI region around the semiconductor chip at the dicing line region is formed to have high resistance.

In usual case, depositions of various insulating films (e.g., oxide film) are carried out plural times in manufacturing steps of the semiconductor integrated circuit. It has been well known for those skilled in the art that the above insulating film 43, etc. which is deposited on concerned portions of the polysilicon film 27 and is disposed at the dicing line 29 shown in FIG. 1A must be removed by an etching step to accomplish a doping (diffusion) step. This removal is executed since dicing efficiency becomes poor if the insulating film, etc. remains on the dicing line 29 in dicing step. Meanwhile, such removal causes impurity doping into the exposed portions of the polysilicon film 27 serving as the dicing line 29 during a diffusion step or an ion-implantation step. As a result, as shown in FIG. 1B, the low resistivity layer 31 having a sheet resistivity of about 1 kΩ/□ to 100 kΩ/□ has been formed inevitably in the prior art. As the result of failure analysis of the semiconductor integrated circuit having the DI structure, inventors of the present invention have found the fact that, if the bonding wires 21, 23 come into contact with peripheral edges of the chip respectively under the condition that the polysilicon 27 having sheet resistivity of essentially more than 1 kΩ/□ is changed into the low resistivity layer 31 having sheet resistivity of several kΩ/□ to several tens kΩ/□ around the chip, the parasitic resistance (parasitic conductance) 5a occurs between the anode pad 13 and the cathode pad 15 of the photodiode 3 via the low resistivity layer 31, as shown in FIG. 1C. Furthermore, based on various experimental results, the inventors of the present invention have found the fact that the parasitic resistance 5a makes the electrical characteristics of the semiconductor integrated circuit such as the optical semiconductor switch having the DI structure degrade extremely.

Accordingly, the present invention is characterized in that a semiconductor structure consisting of a semiconductor chip which has a DI structure wherein active regions serving as device forming regions are electrically isolated by dielectric substance such as oxide film. To the surface of the semiconductor chip of the present invention, two or more bonding wires with different potential are connected. And a polysilicon film is buried on the dielectric substance in the isolation groove between the active regions to form a DI region. Then a part of DI region is used as a dicing line region, wherein the polysilicon film in the isolation groove disposed around the semiconductor chip is formed of undoped polysilicon so as to form high resistivity region. Particularly, it is desired that sheet resistivity of the polysilicon film in the isolation groove formed around the semiconductor chip is more than 1 MΩ/□.

Still further, it is also desired that the secondary side of the bonding wires are bonded to bonding pads of the semiconductor chip constituting the integrated circuit (hybrid IC) of the present invention and such bonding is effected by wedge type bonding or stitch type bonding.

According to the above features of the present invention, even if underloop of two or more bonding wires such as the source bonding wire and the drain bonding wire to come into contact with the polysilicon film exposed at the peripheral portion of the chip and the bonding wires are short-circuited with the surface of the polysilicon film, the parasitic resistance in the equivalent circuit representation shown in FIG. 1C can be omitted since the resistance between the bonding wires is extremely high due to the fact that the polysilicon film exposed at the dicing line region around the chip is formed to have high impedance. In fact, if the value of the parasitic resistance between the underlooped bonding wires is higher than ten times of that of the impedance component 5, the parasitic resistance 5a can be neglected substantially in the equivalent circuit representation. As a result, characteristic variation of the semiconductor chip attributable to the underlooping of the bonding wires in the prior art can be suppressed.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIGS. 7A to 7I are sectional views showing manufacturing steps of the photodiode array chip for use in the optical semiconductor switch according to the second embodiment of the present invention;

DETAILED DESCRIPTION OF THE EMBODIMENTS

Figure 1A:
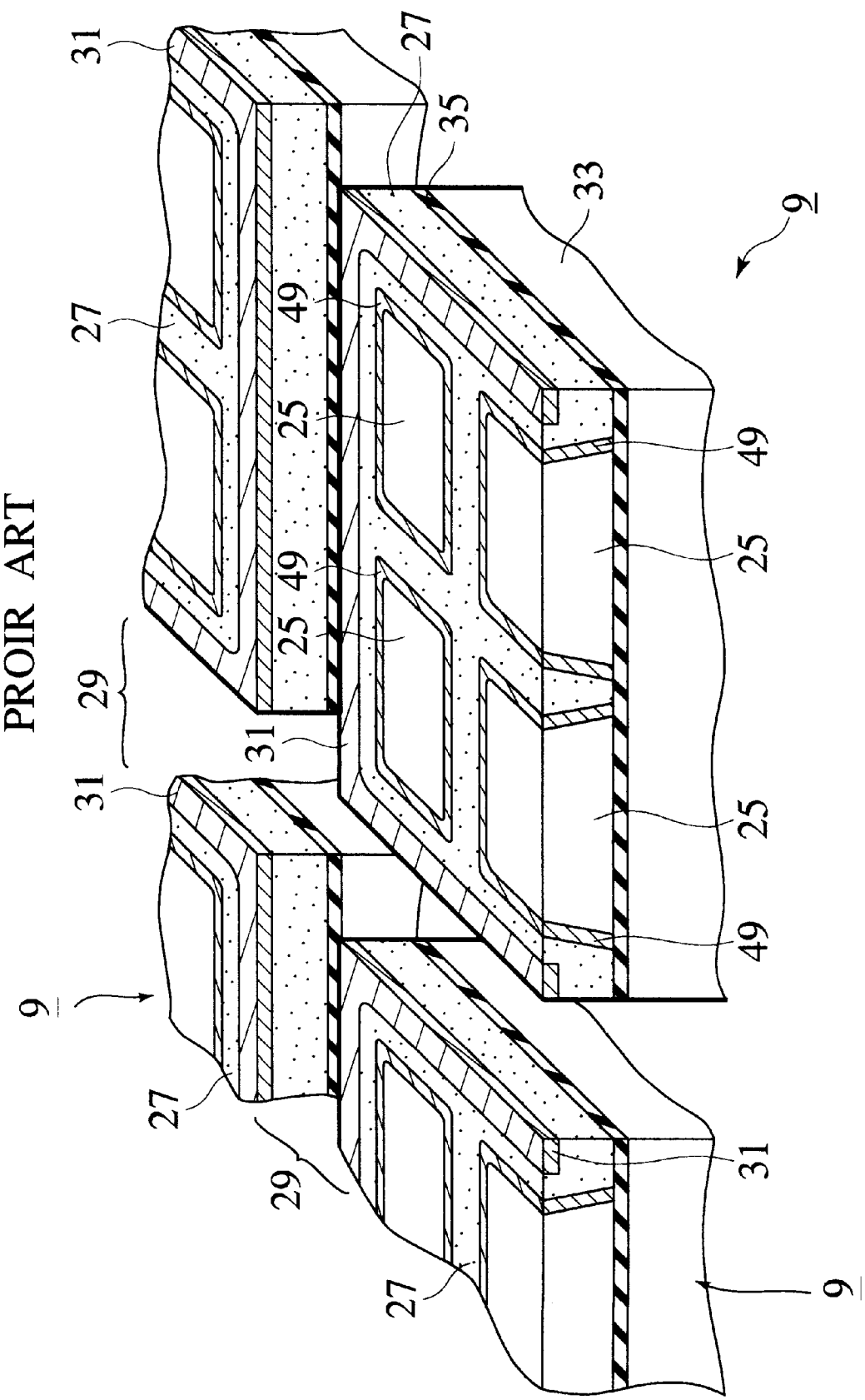
FIG. 1A is a perspective view showing low resistivity layers generated at the surface of dicing lines of photodiode array chips in the prior art.

Various embodiments of the present invention will be described with reference to the accompanying drawings. It is to be noted that the same or similar reference numerals are applied to the same or similar parts or elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.
(First Embodiment)

Figure 1C:
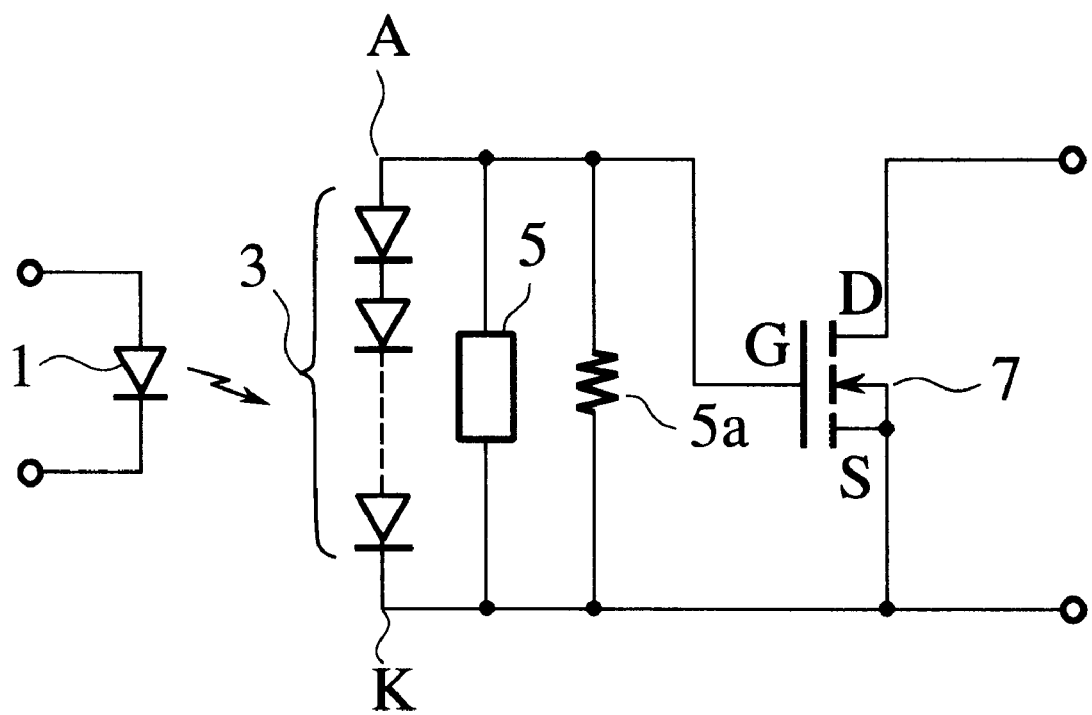
FIG. 1C is an equivalent circuit diagram showing an optical semiconductor switch in the prior art.
Figure 2:
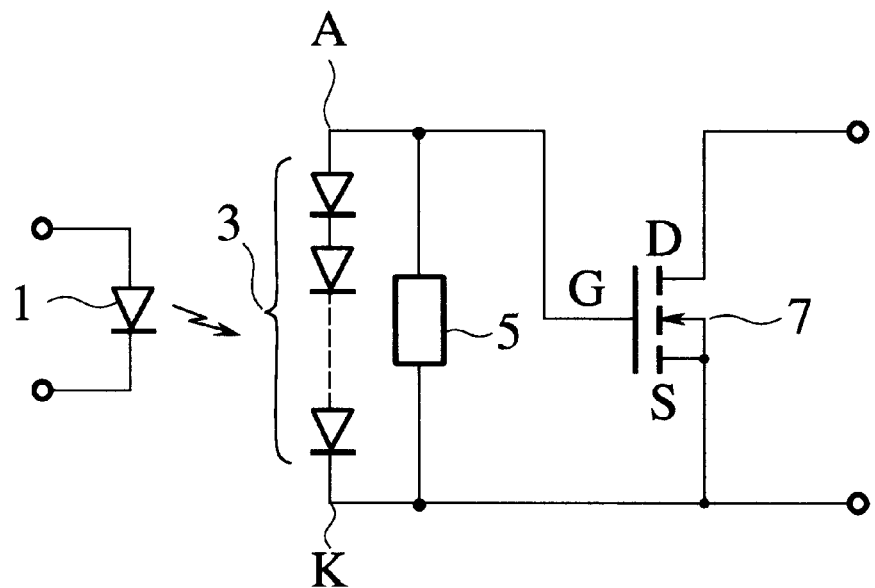
FIG. 2 is a circuit diagram showing an optical semiconductor switch according to a first embodiment of the present invention.

FIG. 2 is a circuit diagram showing an optical semiconductor switch (optical coupler) according to a first embodiment of the present invention. The optical semiconductor switch comprises a light emitting device such as a light emitting diode (LED) 1, a photodiode array 3 optically connected to the light emitting device 1, an impedance component 5 connected in with the parallel photodiode array 3, and a switching device such as a MOSFET 7 in which a gate G and a source S are connected to an anode A and a cathode K of the photodiode array 3 respectively. In contrast to the prior art in FIG. 1C the parasitic resistance (parasitic conductance) 5a which appears in the prior art is neglected substantially, although there may still exist an extremely large parasitic resistance 5a. In the equivalent circuit representation, the parasitic resistance having an impedance larger than 10 times of the impedance component 5 can be omitted substantially.

The photodiode array 3 In the optical semiconductor switch according to the first embodiment of the present invention in FIG. 2 generates an optical electromotive force across the anode A and cathode K, by turning on the LED 1 and irradiating the emitted light from the LED 1 on the surface of the photodiode array 3. Then the generated optical electromotive force is applied between the gate G and the source S of the MOSFET 7 to render the MOSFET 7 conductive (turn-on state). In contrast, the optical electromotive force across the photodiode array 3 is eliminated by turning off the LED 1, and charges accumulated in a gate capacitance between the gate G and the source S of the MOSFET 7 are discharged via the impedance component 5 to render the MOSFET 7 nonconductive (turn-off state). In this manner, a switching operation of the switching device 7 is carried out by turning on and off the light emitting device 1. It is feasible to turn on and off the MOSFET 7 by virtue of a small input current to the LED 1 since the parasitic resistance (see FIG. 1C) which is generated in the prior art is substantially eliminated.

Figure 3:
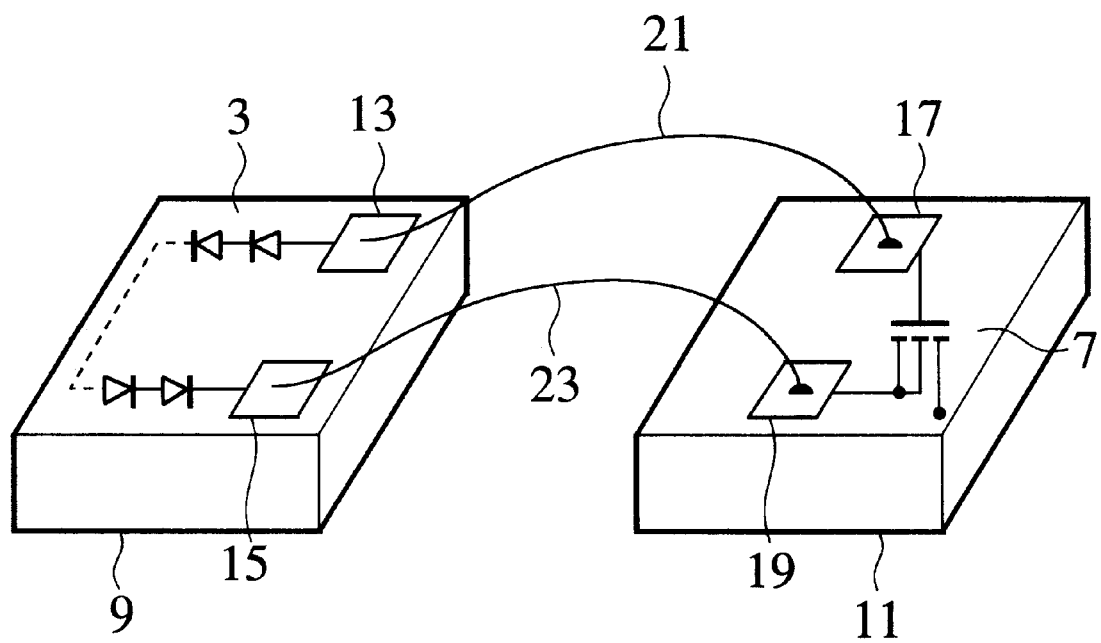
FIG. 3 is a perspective view showing a structure in case the optical semiconductor switch shown in FIG. 2 is composed actually of a semiconductor chip.

In order to constitute actually the optical semiconductor switch according to the first embodiment of the present invention with the use of the semiconductor chip, for example, the photodiode array and the MOSFET serving as the switching device can be achieved by hybrid configurations of two semiconductor chips shown in FIG. 3. In other words, FIG. 3 shows an example wherein the photodiode array and the MOSFET of the optical semiconductor switch shown in FIG. 2 are composed of a first semiconductor chip 9 and a second semiconductor chip 11 respectively. Of course, a chip of the light emitting device (LED) 1 may be added further.

In FIG. 3, the photodiode array 3 composed of a plurality of serially connected photodiodes and the impedance component 5 (not shown) are formed on the photodiode array chip (first semiconductor chip) 9 having the DI structure according to the first embodiment of the present invention. The impedance component 5 may be formed by a diffused layer in the first semiconductor chip 9 or a polysilicon film stacked on the surface of the first semiconductor chip 9. And the MOSFET 7 is formed on the MOSFET chip (second semiconductor chip) 11. An exposed peripheral portion of the first semiconductor chip is formed to have high resistivity.

On respective chips of the photodiode array chip (first semiconductor chip) 9 and the MOSFET chip (second semiconductor chip) 11 are bonding pads formed of materials such as Al, Al—Si, etc. which are metal electrodes used to connect respective chips to the bonding wires serving as internal and/or external lead wirings. In particular, an anode pad 13 and a cathode pad 15 to which the anode A and the cathode K of the photodiode array 3 are to be connected respectively are formed on the photodiode array chip 9, whereas a gate pad 17, a source pad 19, and a drain pad, though not shown, to which the gate G, the source S, and the drain D of the MOSFET 7 are to be connected are formed on the MOSFET chip 11. In the case of the vertical MOSFET, the drain pad may be omitted because a back surface of the second semiconductor chip serves as the drain electrode.

As shown in FIG. 3, in order to connect electrically the photodiode array chip 9 to the MOSFET chip 11, the anode pad 13 on the photodiode array chip 9 and the gate pad 17 on the MOSFET chip 11 are connected by a bonding wire 21 and also the cathode pad 15 on the photodiode array chip 9 and the source pad 19 on the MOSFET chip 11 are connected by a bonding wire 23.

Figure 4:
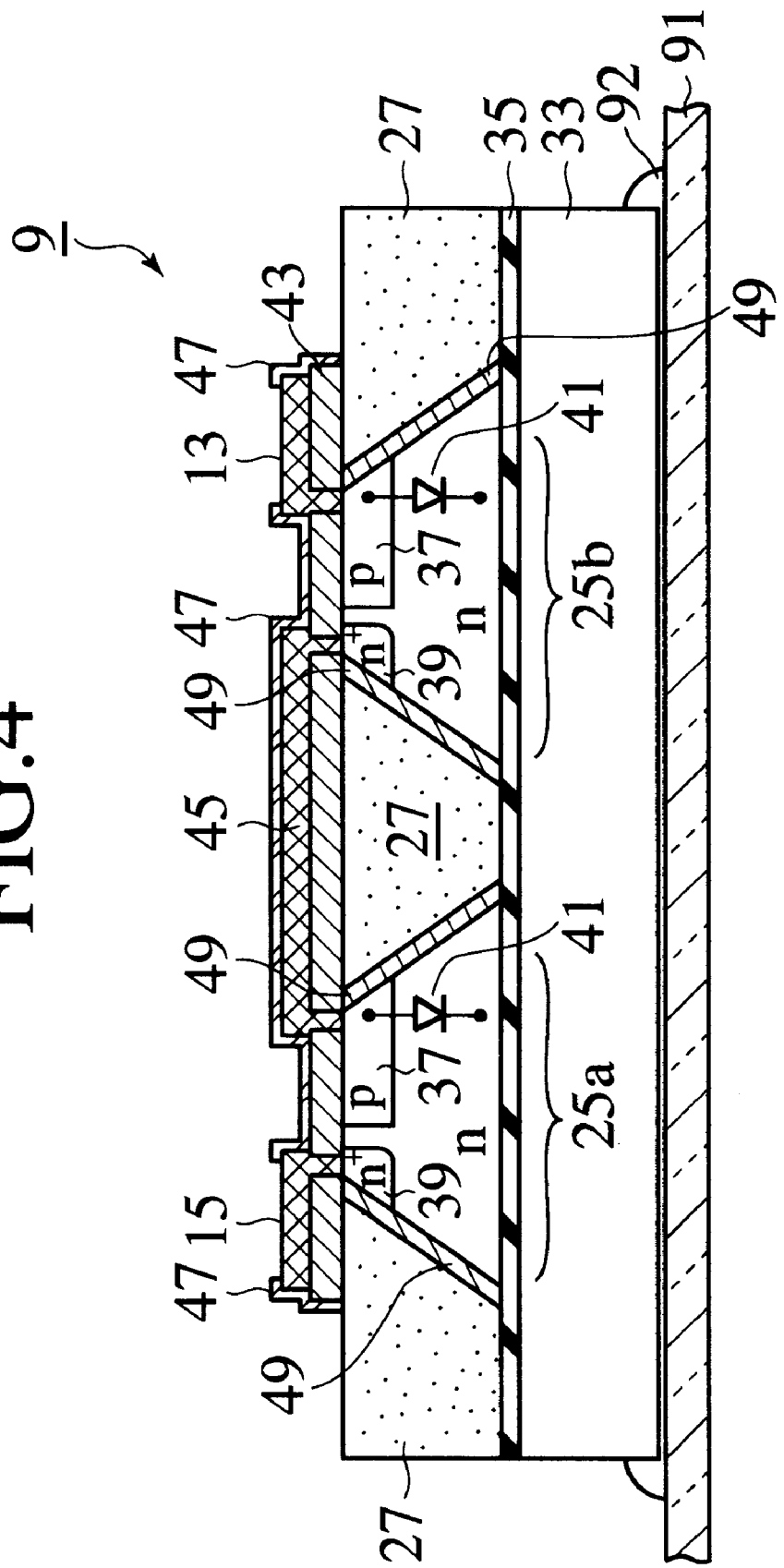
FIG. 4 is a sectional view showing a photodiode array chip for use in the optical semiconductor switch according to the first embodiment of the present invention.

FIG. 4 is a sectional view showing in detail a part of the first semiconductor chip (photodiode array chip) 9 in FIG. 3. In FIG. 4, the photodiode array chip 9 is a semiconductor chip having the DI structure. A plurality of n type Si islands 25 (25a, 25b) serving as active regions are formed on an SOI oxide film 35 formed on a principal surface of a supporting substrate 33. And these active regions 25a, 25b, . . . are mutually isolated by the DI region made up of isolation grooves which have isolation films (isolation oxide films) 49 on their inner walls. A polysilicon film 27 (sheet resistance: 1 MΩ/□) is buried on the isolation films 49 on a surface of the isolation groove between the n type Si islands 25a, 25b, . . . to make a surface of the chip flat. Although the polysilicon films 27 have been illustrated as plural isolated regions in the sectional view in FIG. 4, actually they may be connected electrically to each other. For instance, they may be formed as an identical region in a plane pattern.

A p type diffusion layer 37 serving as the anode region and an $n^+$ type diffusion layer 39 serving as the cathode contact region are formed in the n type Si Island 25a (25b), whereby a photodiode 41 is constituted in the Si island 25a (25b). A plurality of photodiodes 41 formed in respective n type Si islands 25a, 25b, . . . are connected in series. In other words, as shown in FIG. 4, the p type diffusion layer 37 serving as the anode region of a photodiode 25a and the $n^-$ type diffusion layer 39 serving as the cathode contact region of the photodiode 25b are connected to metal wirings 45 formed on an interlayer film (field insulating film) 43 via contact holes provided in the interlayer film 43 such as the oxide film ($SiO_2$ film). It is of course that another metal wiring may, though not illustrated, be provided on the interlayer film 43 to be serially connected to another photodiode (not shown).

Like this, the photodiode array is composed of plural serially connected photodiodes, and the anode or the cathode of the photodiode positioned on both extreme sides of the array act as the anode or the cathode of the overall photodiode array and are connected to the anode pad 13 or the cathode pad 15 shown in FIG. 3 respectively. For example, in FIG. 4, the $n^+$ type diffusion layer 39 serving as the cathode contact region of the photodiode 25a is connected to the cathode pad 15 and the p type diffusion layer 37 serving as the anode region of the photodiode 25b is connected to the anode pad 13. FIG. 4 shows the photodiode array consisting of two photodiodes, but three or more diodes may of course be used in correspondence to a gate threshold voltage $V_{th}$ of the MOSFET 7.

A passivation film 47 such as oxide film ($SiO_2$ film), nitride film ($Si_3N_4$ film), polyimide film is formed on a surface of the photodiode array chip as a surface protection film to prevent characteristic deterioration of the photodiodes due to temperature change, etc. in external atmosphere. However, as shown in FIG. 4, the passivation film 47 is removed from regions on the anode pad 13, the cathode pad 15, and the peripheral portion of the chip. Removal of the film 47 from regions on the anode pad 13 and the cathode pad 15 is made to connect the bonding wires to respective pads, while removal of the film 47 from the region on the peripheral portion of the chip is made to enhance efficiency in dicing step, as described above.

Figure 1B:
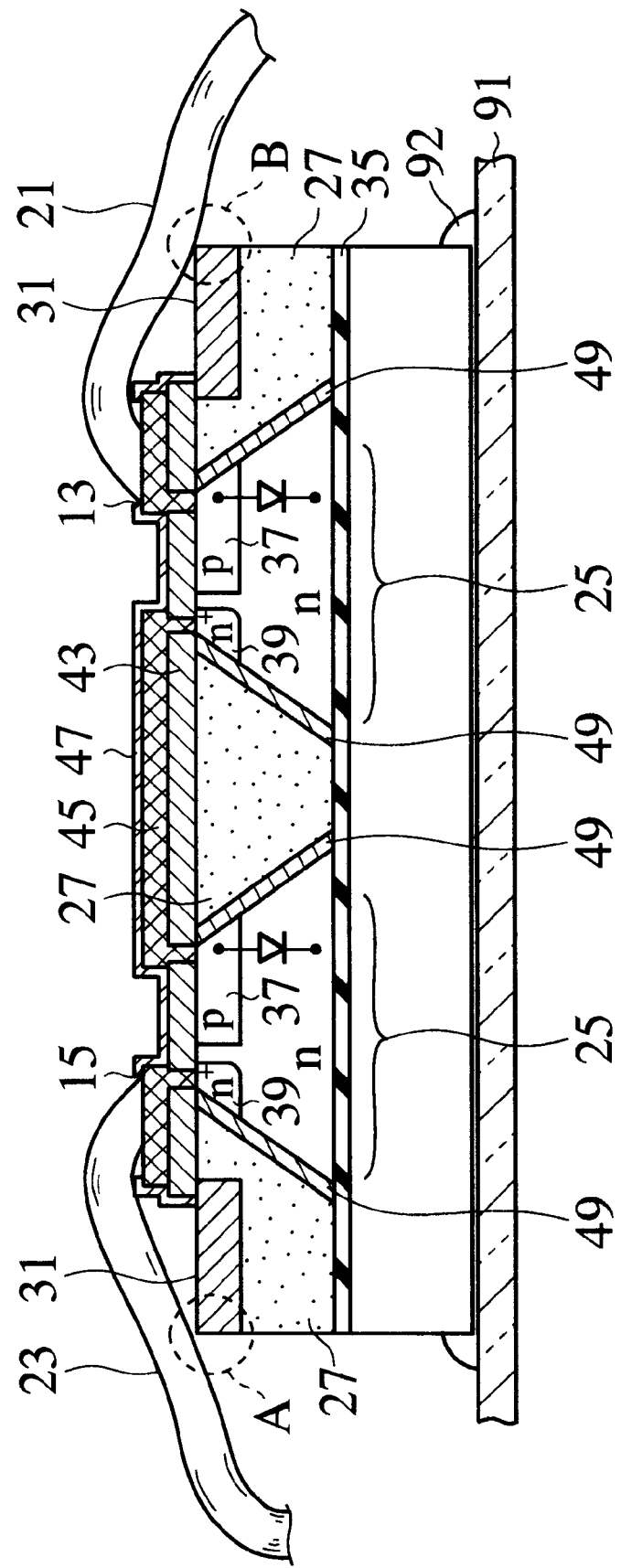
FIG. 1B is a schematic sectional view showing the case wherein underloops of bonding wires are caused in the photodiode array chip in the prior art.

As clearly obvious from FIG. 4, a feature of the photodiode array chip according to the first embodiment of the present invention resides in the affair that the low resistivity layer 31 at the surface of the chip peripheral portion 29, which is formed unintentionally in the conventional photodiode array chip shown in FIGS. 1A and 1B, is not formed.

A manufacturing method of the photodiode array chip (first semiconductor chip) 9 for use in the optical semiconductor switch according to the first embodiment of the present invention will be explained with reference to FIGS. 5A to 5G hereinbelow.

Figure 5A:
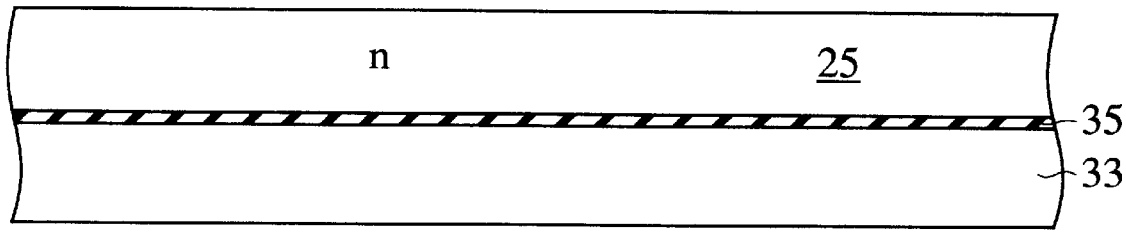
FIGS. 5A to 5G are sectional views showing manufacturing steps of the photodiode array chip for use in the optical semiconductor switch according to the first embodiment of the present invention.
Figure 5B:
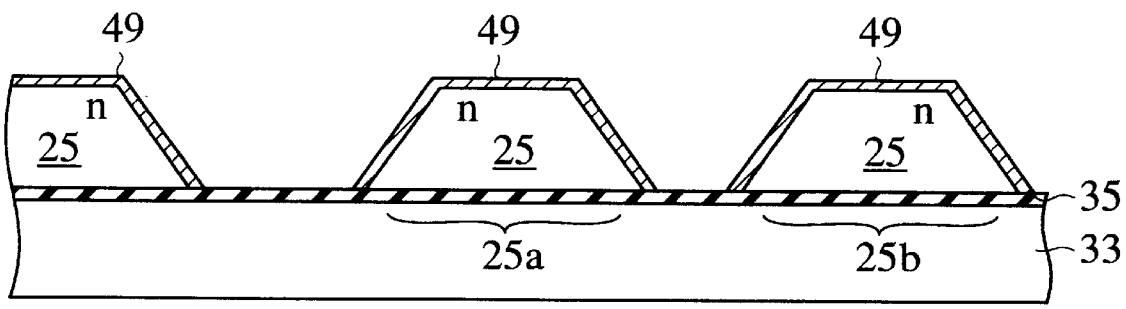

(a) First, as shown in FIG. 5A, an n type Si layer 25 is formed on an Si substrate 33 via an SOI oxide film 35 by using SIMOX (Separation by IMplanted Oxygen) method or silicon-wafer direct bonding method (SDB method). The n type Si layer 25 may be formed on the SOI oxide film 35 by using epitaxial growth method or recrystallization method employing electron beam annealing. Then, as shown in FIG. 5B, V grooves serving as isolation grooves are formed in predetermined regions of the n type Si layer 25 to reach the SOI oxide film 35 and then an isolation film (isolation oxide film) 49 is formed by thermally oxidizing a surface of the resultant structure. The V grooves can be formed by the well known method. For purposes of example, a thermal oxide film of 150 to 300 nm thickness is formed on a surface of the n type Si layer 25, then predetermined regions of the thermal oxide film are etched by the photolithography method to be removed, whereby an etching mask is formed. Then, by making use of the thermal oxide film as the etching mask, the n type Si layer 25 is etched by virtue of anisotropic etching using KOH, ethylenediamine pyrocatechol, or the like. U grooves may be used in place of the V grooves. In the case of the U grooves, RIE or ECR ion etching using $CCl_4$, $SiCl_4$, $PCl_3$, $SF_5$, etc. may be applied.

Figure 5C:
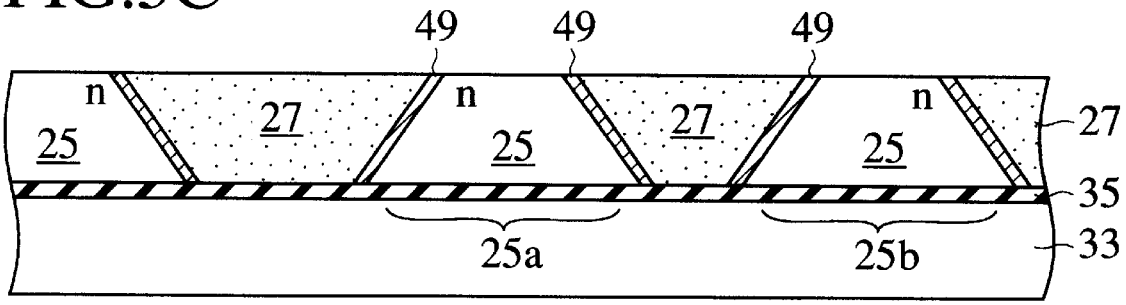
Figure 5D:
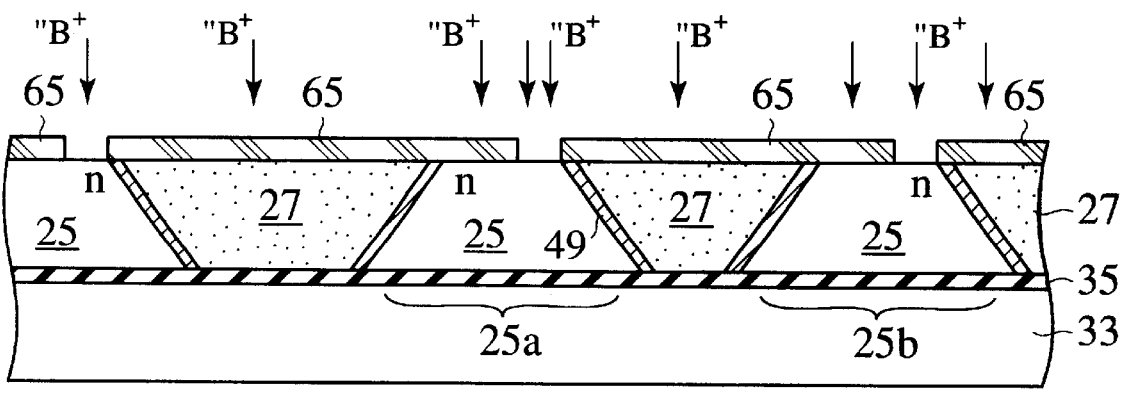

(b) Next, a polysilicon film 27 having sheet resistivity of about 1 MΩ/□ is deposited by the CVD method to bury the V grooves, and then, as shown in FIG. 5C, a surface of the structure is planarized by virtue of CMP (chemical mechanical polishing). Then, as shown in FIG. 5D, $^{11}B^-$ impurities are ion-implanted into the structure using a photoresist 65 as a mask.

Figure 5E:
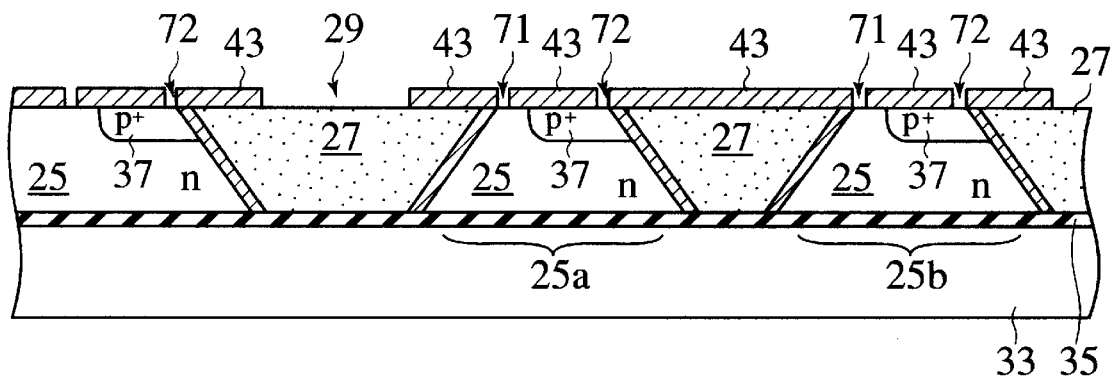

(c) Surfaces of the n type Si layer 25 and the polysilicon film 27 are thermally oxidized to form the field insulating film (interlayer film) 43 of 0.3 to 1.2 μm thickness and to simultaneously conduct annealing after ion-implantation. Implanted $^{11}B^+$ ions are activated by annealing in oxidation so that, as shown in FIG. 5E, p type diffusion layers 37 as the anode region of the photodiode are formed. Then, as shown in FIG. 5E, cathode contact holes 71 and anode contact holes 72 are opened in the oxide film 43 serving as the field insulating film (interlayer film), and at the same time the field insulating film 43 disposed on the dicing line 29 is removed.

Figure 5F:
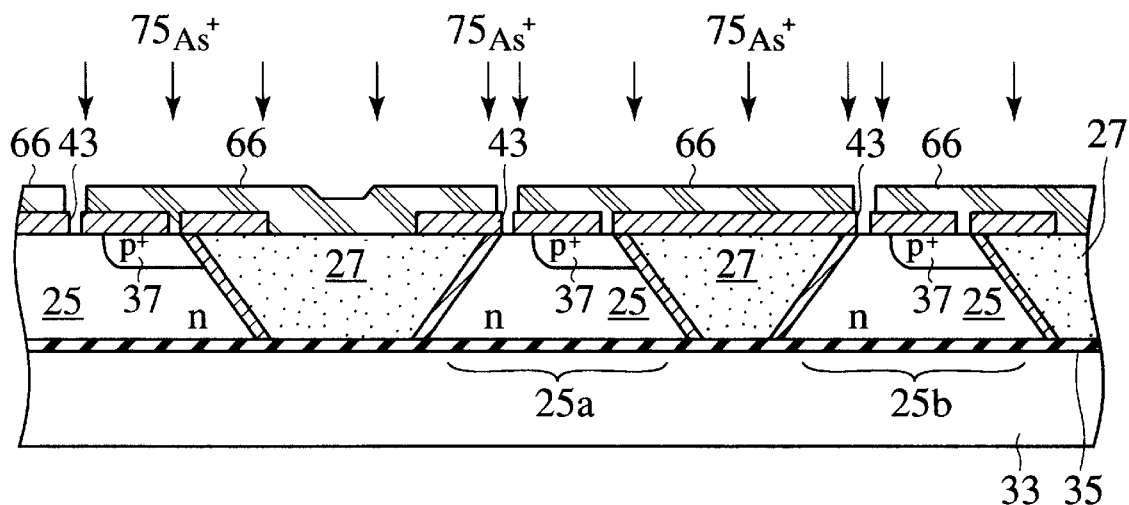

(d) As shown in FIG. 5F, a photoresist 66 is formed on the dicing line 29 and the anode contact holes 72. Then, $^{75}As^-$ are ion-implanted to form cathode contact region via the cathode contact holes 71.

Figure 5G:
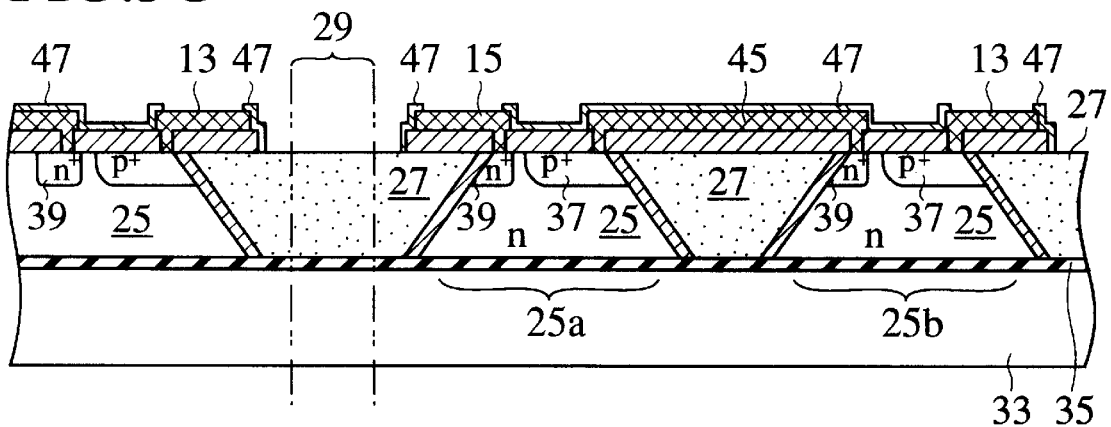

(e) After ion-implantation, the photoresist 66 is removed and then the semiconductor substrate 33 is thermally treated. As shown in FIG. 5G, $n^-$ type diffusion layers 39 are formed according to this thermal treatment. Then, the anode pad 13, the cathode pad 15, and the metal wiring 45 between the anode and the cathode are formed in terms of the well known metallization technologies using metal such as Al, Al—Si, Al—Cu—Si, etc. In turn, the passivation film 47 such as $Si_3N_4$ film, polyimide film, etc. is deposited on the metal wiring 45. As shown in FIG. 5G, the passivation film 47 on the anode pad 13, the cathode pad 15, and the dicing line 29 are selectively removed. Next, the semiconductor chip (mother chip) is cut away along the dicing line 29 using a diamond blade, etc. to form a plurality of semiconductor chips having a predetermined size. Each semiconductor chip is fixed on the substrate (or lead frame) 91 by adhesive 92 (or solder). Then the photodiode array chip according to the first embodiment of the present invention shown in FIG. 4 has been finished.

As shown in FIG. 5F, since ion-implantation is carried out while the surface of the polysilicon film 27 is masked with the photoresist 66, the impurity is in no way doped into the polysilicon film 27 located in the peripheral exposed portion of the chip. Accordingly, the low resistivity layer 31, which being the problem in the prior art, can be prevented from being generated on the exposed surface of the polysilicon which is disposed at the peripheral portion of the chip.

In the photodiode array chip according to the first embodiment of the present invention having the sectional shape shown in FIG. 4, the bonding wire 21 is connected to the anode pad 13 and the bonding wire 23 is connected to the cathode pad 15, as shown in FIG. 3. At this time, even if underloop of both the bonding wire 21 and the bonding wire 23 is caused and therefore both the bonding wire 21 and the bonding wire 23 contact with the polysilicon film exposed at the peripheral portion of the chip, the problem with low parasitic resistance 5a shown in FIG. 1C are not substantially produced. This is because, unlike the conventional photodiode array chip shown in FIGS. 1A and 1B, the low resistivity layer 31 has not been formed in the DI region and the conductance between the underlooped wires can be substantially neglected. Accordingly, characteristic variation of the semiconductor chip which being regarded as the problem in the prior art can be eliminated.

Underloop of the bonding wire described above is likely to be generated on the secondary side of the bonding. Therefore, in the event that the anode pad 13 and the cathode pad 15 of the photodiode array chip shown in FIG. 4 are connected on the secondary side and also wedge type bonding or stitch type bonding is used as such bonding, a remarkable advantage can be achieved by the first embodiment of the present invention.

(Second Embodiment)

Figure 6:
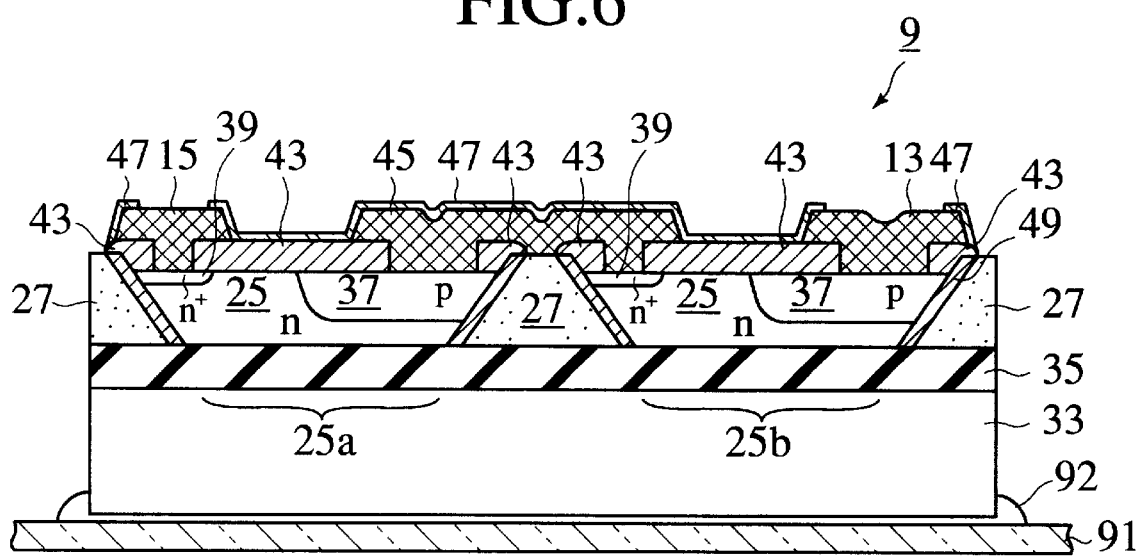
FIG. 6 is a sectional view showing a photodiode array chip for use in an optical semiconductor switch according to a second embodiment of the present invention.

FIG. 6 is a sectional view showing a photodiode array chip for use in an optical semiconductor switch according to a second embodiment of the present invention. A circuit configuration as the optical semiconductor switch is similar to that described in the first embodiment and shown in FIG. 2, and therefore the description thereof is omitted.

As shown in FIG. 6, the photodiode array chip 9 according to the second embodiment of the present invention is a semiconductor chip having the DI region formed as an inverse mesa shape. A plurality of n type Si islands 25 (25a, 25b) serving as active regions are formed on the SOI oxide film 35 formed on the principal surface of the supporting substrate 33. In addition, respective n type Si islands 25 are electrically isolated by the isolation films 49 formed on the surfaces of the isolation grooves, each having the inverse mesa shape. The polysilicon film 27 (sheet resistivity: 1 MΩ/□) is formed on the isolation films 49 on the surface of the isolation groove between the n type Si islands 25a, 25b to bury the isolation groove and to planarize the surface of the chip. The polysilicon films 27 have been illustrated as plural isolated regions in the sectional view, but they are connected electrically to each other in practice.

The p type diffusion layer 37 serving as the anode region and the n+ type diffusion layer 39 serving as the cathode contact region are formed in the n type Si island 25a (25b) by diffusion steps. Thus, the photodiode 41 is formed in the Si island 25a (25b). A plurality of photodiodes 41 formed in respective n type Si islands 25a, 25b, . . . are connected in series. In other words, as shown in FIG. 6, the p type diffusion layer 37 serving as the anode region of the photodiode 25a and the n⁻ type diffusion layer 39 serving as the cathode contact region of the photodiode 25b are connected to metal wirings 45 formed on an interlayer film (field insulating film) 43 via contact holes provided in the interlayer film 43 such as the oxide film (SiO₂ film). Further, as shown in FIG. 6, in the photodiode array chip 9 according to the second embodiment of the present invention, the passivation film 47 such as oxide film (SiO₂ film), nitride film (Si₃N₄ film), polyimide film is formed on the anode pad 13, the cathode pad 15, and others as the surface protection film to prevent degradation in characteristic of the photodiodes. However, the passivation film 47 is removed from regions on the anode pad 13, the cathode pad 15, and the dicing line region disposed at the peripheral portion of the chip.

In the photodiode array chip 9 according to the second embodiment of the present invention having the structure shown in FIG. 6, as in the first embodiment, the bonding wire 21 is connected to the anode pad 13 and the bonding wire 23 is connected to the cathode pad 15. At this time, even if underloop of both the bonding wire 21 and the bonding wire 23 is caused and thus both the bonding wire 21 and the bonding wire 23 come into contact with the polysilicon film exposed at the peripheral portion of the chip, the problems with the low parasitic resistance 5a shown in FIG. 1C are not substantially produced. This is because, unlike the conventional photodiode array chip shown in FIGS. 1A and 1B. the low resistivity layer 31 has not been formed on the surface of the exposed polysilicon film and thus the peripheral portion of the chip acting as the dicing line region is rendered to have high impedance. Therefore, according to the second embodiment of the present invention, characteristic variation of the semiconductor chip which appears as a disadvantage in the prior art can be eliminated. The same is true of the MOSFET chip. As a result, reliability of the optical semiconductor switch can be improved.

The photodiode array chip for use in the optical semiconductor switch according to the second embodiment of the present invention can be manufactured simply at low cost by the method shown in FIGS. 7A to 7I.

Figure 7A:
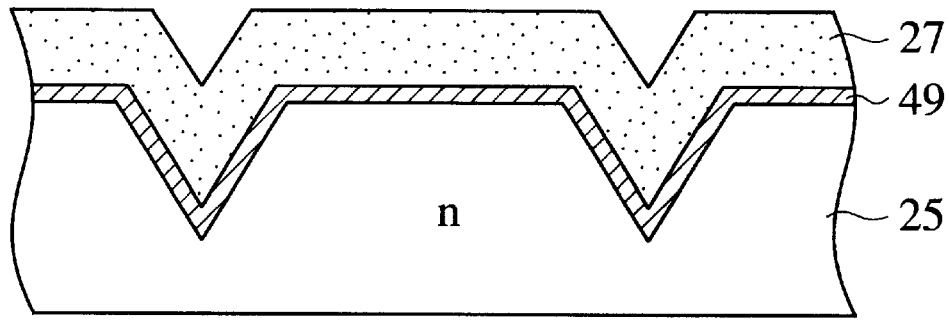

(a) At first, as shown in FIG. 7A, an n type (100) plane Si substrate 25 is prepared and then isolation grooves (V grooves) of a 2 to 5 μm depth are formed in predetermined regions on the surface of the substrate 25. Here "predetermined regions" means such regions serving as DI regions finally. Formation of the V grooves can be executed by the well known method. For purposes of example, a thermal oxide film of 150 to 300 nm thickness is formed on a surface of the n type Si substrate 25, then a mask pattern for V groove etching is formed by virtue of the photolithography method. More particularly, predetermined regions of the thermal oxide film are removed by etching, then the n type Si substrate 25 is etched by virtue of anisotropic etching using KOH, ethylenediamine pyrocatechol, or the like by making use of the thermal oxide film as the etching mask. Now the V groove is a mere example, and U grooves may be used in place of the V grooves. In the case of the U grooves, RIE or ECR ion etching using CCl₄, SiCl₄, PCl₃, SF₆, etc. may be applied. Then, an isolation film (isolation oxide film) 49 is formed on the surface of the V grooves (or U grooves) by using thermal oxidation to have a thickness of 100 to 300 nm. Then, a polysilicon film 27 having sheet resistivity of 1 M Ω/□ is deposited thicker than a depth of the V grooves by the CVD method.

Figure 7B:
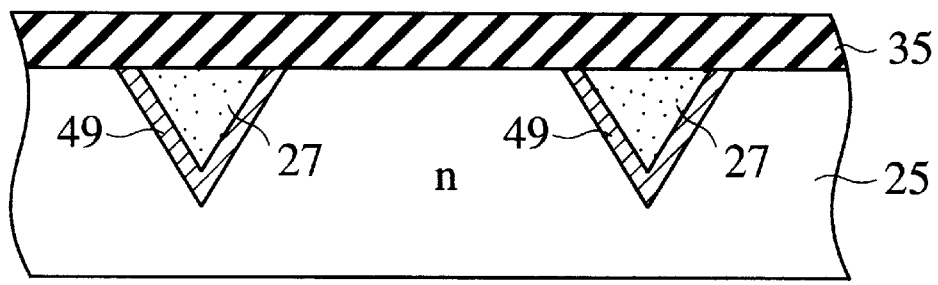

(b) Until the top surface of the n type Si substrate 25 is exposed, as shown in FIG. 7B, the structure shown in FIG. 7A is polished by the CMP method to planarize a surface of the polysilicon film 27 and the substrate. Next, an SDB oxide film 35 having an about 1.0 to 2 μm thickness is formed by the LFCVD method using SiH₄ and N₂O, or the LPCVD method using an organic silicon source such as TEOS, DADBS, OMCTS, TMS, HMD. Alternatively, a spin-on-glass (SOG) may be coated on the top surface of the substrate by a spinner, etc. Then, after a back surface of the substrate is fixed by vacuum suction, the SDB oxide film 35 is polished up to a thickness of 0.3 to 1.5 µm and is planarized by the CMP method, etc. to obtain a mirror like surface, as shown in FIG. 7B. If the organic silicon CVD method is utilized, it is effective that the substrate is annealed in atmospheric gas such as $N_2O_2$, HCl, etc. and then is planarized to adjust the thickness.

Figure 7C:
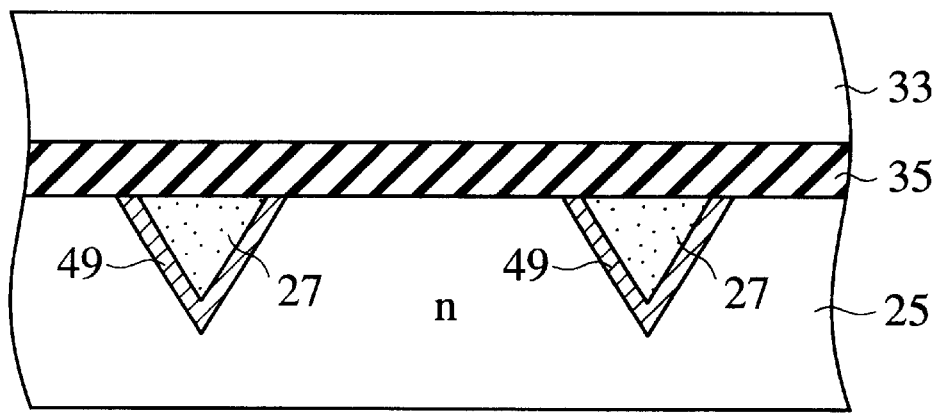

(c) Next, another n type Si substrate 33 having a mirror finished surface is prepared. Then, as shown in FIG. 7C, the n type Si substrate 25 and the n type Si substrate 33 are mated together with facing mirror surface of the substrate 33 to mirror surface of the SDB oxide film 35. Then, an SDB substrate is formed by annealing a resultant structure at a substrate temperature of 1100 to 1150° C. for one to two hours. In this event, annealing may be executed while applying pulse voltage in a low pressure (vacuum) state. For instance, a pressure is lowered up to 0.1 Pa and then the pulse voltage on the order of ±350 V may be applied to the substrate at a substrate temperature 800° C. for about ten minutes.

Figure 7D:
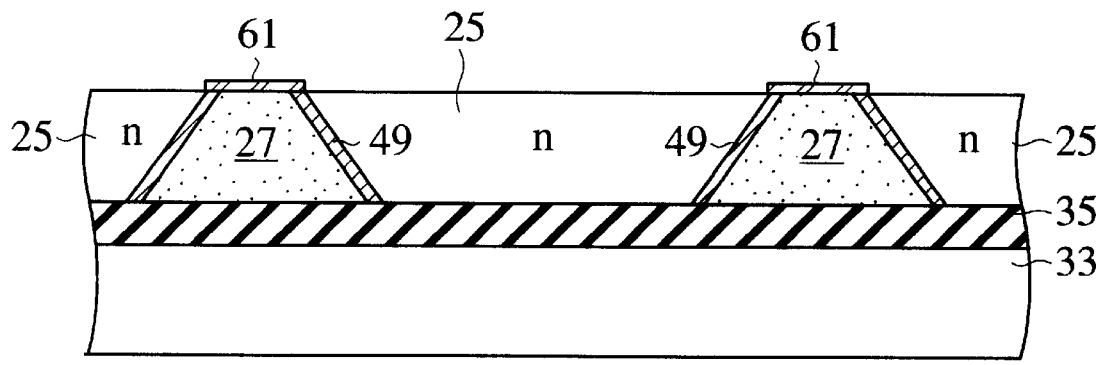

(d) Then, a back surface of the n type Si substrate 25 is polished so as to thin down the n type Si substrate 25 until bottom part of the polysilicon film 27 is exposed at the back surface of the n type Si substrate 25. Although FIG. 7D is a sectional view showing the substrate in this state, the n type Si substrate 25 is positioned upwardly by inverting FIG. 7C. Accordingly, a plurality of n type Si substrates 25, each of which is surrounded by the isolation film 49 and the polysilicon film 27, are formed separately via these steps. After this, an $Si_3N_4$ film 61 is formed in 150 to 200 nm thick by the CVD method, and then, as shown in FIG. 7D, the $Si_3N_4$ film 61 is selectively formed only on the polysilicon 27 by virtue of the photolithgraphy method and the RIE method.

Figure 7E:
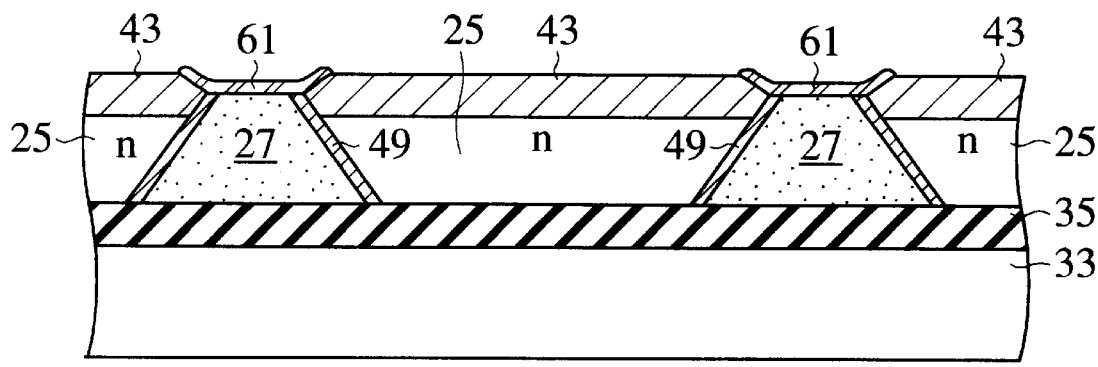
Figure 7F:
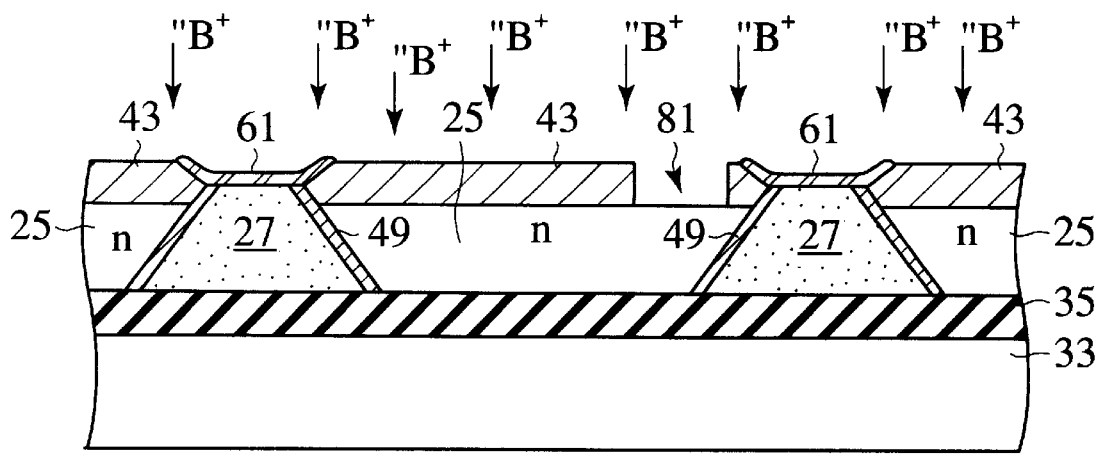

(e) Then, a surface of the resultant structure is selectively oxidized by using the $Si_3N_4$ film 61 as a mask. As shown in FIG. 7E, by using the so-called LOCOS method, an oxide film 43 is formed on a surface of the n type Si substrates 25 as a field insulating film having a 0.3 to 1.0 µm thickness. Diffusion windows 81 are opened in the field insulating film 43 and, as shown in FIG. 7F, p type impurity ions such as $^{11}B^+$, $^{10}BF_2^+$ are ion-implanted at acceleration voltage 30–80 KeV. After ion implantation, as shown in FIG. 7G, p type diffusion layer 37 serving as the anode region is formed by annealing. Then, a photoresist 63 is applied on an overall surface of the structure and then cathode contact holes 71 are opened in the field insulating film 43 by virtue of the photolithography method. Using the photoresist 63 used to open the cathode contact holes 71 as an ion implantation mask, n type impurity ions such as 31 $p^+$, 75 $As^+$ are ion-implanted at acceleration voltage 50–150 KeV. After ion implantation, if the photoresist 63 is removed and annealing is carried out, $n^-$ diffusion layers 39 serving as cathode contact regions are formed, as shown in FIG. 7H. After annealing, the $Si_3N_4$ film 61 is removed by the RIE method to expose the polysilicon 27.

(f) In turn, a metal such as Al or Al—Si is deposited by vacuum deposition method, sputtering method, etc. and then, as shown in FIG. 7H, a cathode pad 15, a metal wiring 45, and an anode pad (not shown) are formed by well known metallization technologies. Then, as shown in FIG. 7I, a passivation film 47 such as $Si_3N_4$ film or polyimide film is deposited on an entire surface of the structure and then the passivation film 47 is removed from the regions on the bonding pads such as cathode pad, anode pad, etc. and on the dicing line regions 29. If the resultant structure is cut out by the diamond blade, etc. along the dicing line regions 29, the photodiode array chip according to the second embodiment of the present invention shown in FIG. 6 has been completed.

(Third Embodiment)

Figure 8A:
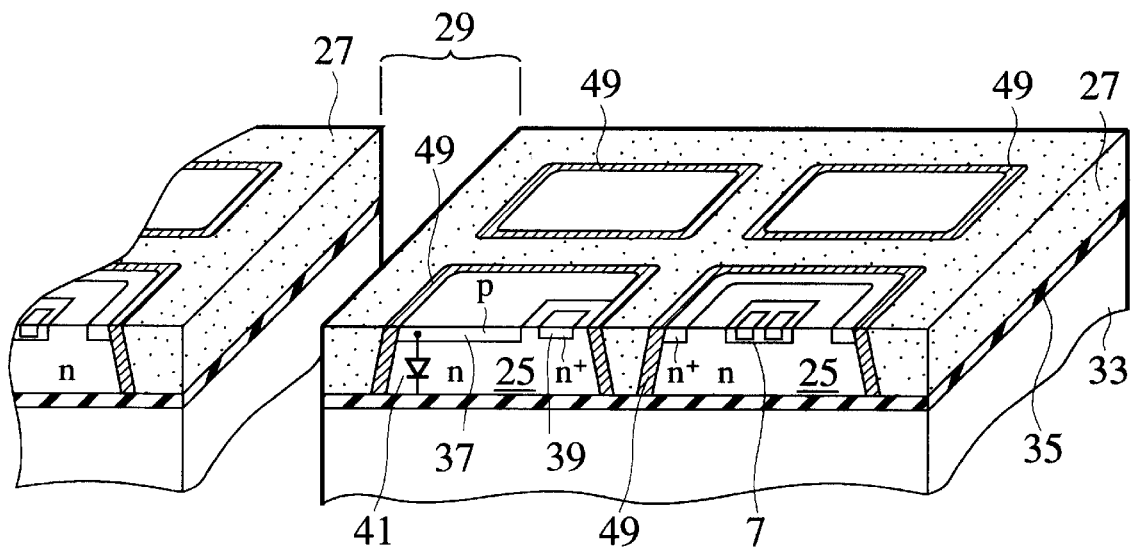
FIG. 8A is a perspective view showing a semiconductor chip according to a third embodiment of the present invention.

In the first and second embodiments of the present invention, the photodiode array chip in which a plurality of photodiodes are connected in series has been explained as the semiconductor chip having the DI structure, but the present invention should not be limited to such photodiode array chip. For example, as in a third embodiment of the present invention shown in FIG. 8A, similar effects can be achieved in a semiconductor chip in which the photodiode 41 and the switching device (the MOSFET) 7 are formed as one chip. As shown in FIG. 8A, the semiconductor chip according to the third embodiment of the present invention is a semiconductor chip having the DI structure. A plurality of n type Si islands 25 serving as active regions are formed on the SOI oxide film 35 which is formed on the principal surface of the supporting substrate 33. Respective n type Si islands 25 are electrically isolated by the isolation grooves each having the isolation film 49 such as oxide ($SiO_2$) film on its inner wall. The polysilicon film 27 (sheet resistivity: 1 MΩ/□) is formed on the isolation films 49 on the surface of the isolation groove between the n type Si Islands 25 to bury the isolation groove and to planarize the chip surface. The polysilicon films 27 are connected electrically to each other in practice.

Figure 8B:
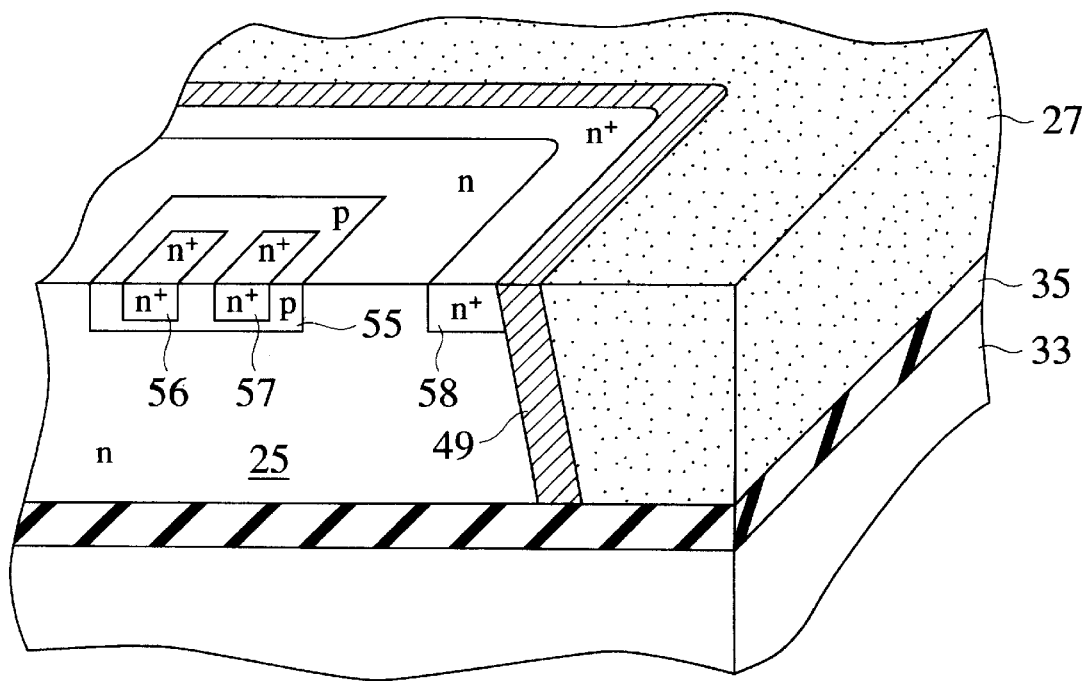
FIG. 8B is an enlarged fragmental perspective view showing the semiconductor chip in FIG. 8A.

The p type diffusion layer 37 serving as the anode region and the $n^-$ type diffusion layer 39 serving as the cathode contact region are formed in one of the n type Si islands 25 shown in FIG. 8A, thereby forming the photodiode 41. A p well 55 (see FIG. 8B) is formed in other n type Si island 25 and then the n-channel MOSFET 7 is formed in the p well 55. An enlarged fragmental view showing the n-channel MOSFET 7 is FIG. 8B. The n-channel MOSFET 7 of the present invention employs the $n^-$ type diffusion layer 56 in the p well 55 as the source region and also the $n^+$ type diffusion layer 57 as the drain region. For simplicity, illustration of the gate oxide film, the gate electrode, the source electrode, and the drain electrode etc. are omitted. Furthermore, like the first and second embodiments, the passivation film 47 serving as the surface protection film to prevent characteristic deterioration of the photodiodes and MOSFET due to temperature, etc. in atmosphere is formed on the surface of the semiconductor chip shown in FIG. 8A, but illustration of the passivation film 47 is omitted. In the third embodiment of the present invention, the passivation film is removed at regions on the anode pad, the cathode pad, the gate pad, the source pad, the drain pad, and the polysilicon film 27 disposed at the peripheral portion of the chip. Removal of the passivation film 47 from regions on the anode pad 13, the cathode pad 15, the gate pad, the source pad and the drain pad is needed to connect the bonding wires to respective pads, while removal of the film 47 at the peripheral portion of the chip is needed to expose the polysilicon film in the dicing line region, thereby enhancing efficiency in dicing step.

Like the first and second embodiments, the semiconductor chip according to the third embodiment of the present invention is characterized in that the low resistivity layer 31 on the surface of the exposed polysilicon film, which had been formed unintentionally in the photodiode array chip shown in the prior art, is not formed.

According to the third embodiment of the present invention, even if underloop of two or more bonding wires such as source bonding wire and drain bonding wire is caused and thus such bonding wires come into contact with the polysilicon film exposed at the peripheral portion of the chip, characteristic variation of the semiconductor chip in the prior art is never caused since the polysilicon film exposed in the dicing line region around the chip is made high impedance. Therefore, according to the third embodiment of the present invention, the DI semiconductor integrated circuit with high reliability can be provided at low manufacturing cost.

Various modifications will become possible for those skilled in the art after receiving the teachings of the present disclosure without departing from the scope thereof. For instance, the present invention is not limited to the above optical semiconductor switch. Also, devices used in the integrated circuit are not limited to the photodiode or the MOSFET. In detail, the same or similar advantages will be achieved if the photodiode discussed in the above first to third embodiments is replaced with a driver IC or if the MOSFET in the above first to third embodiments is replaced with power bipolar transistor, IGBT (Insulated Gate Bipolar Transistor), or SIT (Static Induction Transistor). Further, the bonding wires are not limited two in number and more than two bonding wires are similarly applicable in the present invention as far as respective bonding wires have different potentials.

What is claimed is:

1. A switching apparatus, comprising:
   at least two bonding wires;
   gate, source and drain electrodes; and
   an impedance element connected between the gate and the source electrodes: the switching apparatus including an integrated circuit having a dielectric isolation region consisting essentially of an isolation film formed on an inner wall of an isolation groove disposed in a semiconductor chip and a polysilicon film formed on the isolation film to bury the isolation groove, and an active region, electrically connected to said source and drain electrodes, surrounded by the dielectric isolation region,
   wherein a top surface of the polysilicon film positioned at an outer edge portion of the semiconductor chip is formed to have a resistivity so that an equivalent impedance between any two of the at least two bonding wires when the any two bonding wires contact the top surface of the polysilicon film is larger than a value of the impedance element.

2. The switching apparatus of claim 1, wherein the surface of the polysilicon film is formed of undoped polysilicon.

3. An integrated circuit having a dielectric isolation region consisting essentially of an isolation film formed on an inner wall of an isolation groove disposed in a semiconductor chip and a polysilicon film formed on the isolation film to bury the isolation groove,
   wherein a top surface of the polysilicon film positioned at an outer edge portion of the semiconductor chip is formed to have sheet resistivity of more than 1 M $\Omega/\square$.

4. The integrated circuit of claim 3 further comprising:
   a first bonding pad and a second bonding pad;
   a first bonding wire, a secondary side of which is bonded to the first bonding pad; and
   a second bonding wire, a secondary side of which is bonded to the second bonding pad, the second bonding wire having a different potential from the first bonding wire.

5. The integrated circuit of claim 4, wherein the first bonding wire and the second bonding wire are connected to the first bonding pad and the second bonding pad by wedge bonding respectively.

6. The integrated circuit of claim 4, wherein the first bonding wire and the second bonding wire are connected to the first bonding pad and the second bonding pad by stitch bonding respectively.

7. A switching apparatus, comprising:
   at least two bonding wires;
   gate, source and drain electrodes; and
   an impedance element connected between the gate and the source electrodes; the switching apparatus including an integrated circuit comprising a first semiconductor chip and a second semiconductor chip, each chip having a dielectric isolation region consisting essentially of an isolation film formed on an inner wall of an isolation groove disposed in each chip and a polysilicon film formed on the isolation film to bury the isolation groove, and an active region, electrically connected to said source and drain electrodes,
   wherein a top surface of the polysilicon film positioned at outer edge portions of each of the first and the second semiconductor chips is formed to have a resistivity so that an equivalent impedance between any two of the at least two bonding wires when the any two bonding wires contact the top surface of the polysilicon film is larger than a value of the impedance element.

8. The switching apparatus of claim 7, wherein the surface of the polysilicon films are formed of undoped polysilicon.

9. An integrated circuit comprising a first semiconductor chip and a second semiconductor chip, each chip having a dielectric isolation region consisting essentially of an isolation film formed on an inner wall of an isolation groove disposed in each chip and a polysilicon film formed on the isolation film to bury the isolation groove;
   wherein a top surface of the polysilicon film positioned at an outer edge portion of each of the semiconductor chips is formed to have a sheet resistivity of more than 1 M $\Omega/\square$.

10. The switching apparatus of claim 7, wherein the first and the second semiconductor chips are mounted on a common substrate, respectively.

11. The integrated circuit of claim 9, wherein the first semiconductor chip has a first bonding pad and a second bonding pad,
   the second semiconductor chip has a third bonding pad and a fourth bonding pad,
   the first and the third bonding pads are connected to each other by a first bonding wire, and
   the second and the fourth bonding pads are connected to each other by a second bonding wire which has different potential to the first bonding wire.

12. The integrated circuit of claim 11, wherein the first and the second bonding wires are connected to the first and the second bonding pads by wedge bonding respectively.

13. The integrated circuit of claim 11, wherein the first and the second bonding wires are connected to the first and the second bonding pads by stitch bonding respectively.

14. The integrated circuit of claim 11, wherein a photodiode array is integrated in the first semiconductor chip, and a switching device is integrated in the second semiconductor chip.

15. The integrated circuit of claim 12, wherein the switching device is formed of MOSFET.

16. The integrated circuit of claim 13, wherein the first bonding pad is an anode pad,
   the second bonding pad is a cathode pad,
   the third bonding pad is a gate pad, and
   the fourth bonding bad is a source pad.

17. The integrated circuit of claim 14, further comprising a light emitting device for irradiating the photodiode array with a light.

18. The switching apparatus of claim 1, further comprising:
   a first bonding pad connected to the gate electrode; and
   a second bonding pad connected to the source electrode,
   wherein one of the bonding wires is bonded to the first bonding pad and another one of the bonding wires is bonded to the second bonding pad.

19. The switching apparatus of claim 1, wherein the sheet resistivity of the polysilicon film is more than 1 M $\Omega/\square$.

20. The switching apparatus of claim 7, further comprising a photodiode array formed in an active region surrounded by the dielectric isolation region in the first semiconductor chip.

21. The switching apparatus of claim 7, further comprising:
   a first bonding paid connected to the gate electrode; and
   a second bonding pad connected to the source electrode,
   wherein one of the bonding wires is bonded to the first bonding pad and another one of the bonding wires is bonded to the second bonding pad.

22. The switching apparatus of claim 7, wherein the sheet resistivity of the polysilicon film is more than 1 M $\Omega/\square$.

23. A semiconductor chip comprising:
   a first active region;
   a second active region; and
   a dielectric isolation region,
   wherein the dielectric isolation region is disposed between and surrounds said first and second active regions and consists essentially of an isolation film formed on respective outer surfaces of the active regions and a polysilicon film formed on the isolation films to surround the respective active regions;
   wherein a top surface of the polysilicon film positioned at an outer edge portion of the semiconductor chip is formed to have substantially the same sheet resistivity as that of the polysilicon film disposed between the first and second active regions.

* * * * *